United States Patent
Yan et al.

(10) Patent No.: US 10,534,036 B2
(45) Date of Patent: Jan. 14, 2020

(54) AUTOMATIC TRANSFER SWITCH DEVICE HEALTH MONITORING

(71) Applicant: Cummins Power Generation IP, Inc., Minneapolis, MN (US)

(72) Inventors: Jiaxiang Yan, Minneapolis, MN (US); Brian G. Dye, Eden Prairie, MN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 193 days.

(21) Appl. No.: 15/274,792

(22) Filed: Sep. 23, 2016

(65) Prior Publication Data

US 2018/0088177 A1 Mar. 29, 2018

(51) Int. Cl.
*G01R 31/333* (2006.01)
*H02J 9/06* (2006.01)
*H01H 11/00* (2006.01)

(52) U.S. Cl.
CPC ..... *G01R 31/3333* (2013.01); *H01H 11/0062* (2013.01); *H02J 9/06* (2013.01); *H02J 9/061* (2013.01); *H01H 2300/018* (2013.01); *H02J 2009/068* (2013.01)

(58) Field of Classification Search
CPC ......................................... G01R 31/327–3333
See application file for complete search history.

(56) References Cited

U.S. PATENT DOCUMENTS

| | | |
|---|---|---|
| 4,189,649 A | 2/1980 | Przywozny et al. |
| 4,672,227 A | 6/1987 | Lagree et al. |
| 6,534,737 B1 * | 3/2003 | Rademacher ............ H01H 1/60 200/1 V |
| 6,876,103 B2 | 4/2005 | Radusewicz et al. |
| 7,362,696 B2 | 4/2008 | Ferry et al. |
| 7,781,919 B2 * | 8/2010 | Black ................ H05B 37/0245 307/139 |
| 8,102,285 B2 | 1/2012 | Vile et al. |
| 8,766,489 B2 | 7/2014 | Lathrop |
| 9,081,568 B1 | 7/2015 | Ross et al. |
| 9,250,294 B2 | 2/2016 | Wagner et al. |
| 9,685,786 B1 * | 6/2017 | Owen ...................... H02J 3/04 |

(Continued)

FOREIGN PATENT DOCUMENTS

WO WO-2008/003033 1/2008

OTHER PUBLICATIONS

International Search Report and Written Opinion for International Application No. PCT/US2017/052520, dated Dec. 7, 2017, 11 pages.

*Primary Examiner* — Walter L Lindsay, Jr.
*Assistant Examiner* — Milton Gonzalez
(74) *Attorney, Agent, or Firm* — Foley & Lardner LLP

(57) ABSTRACT

A method includes measuring, by at least one processor, a time at which control circuitry sends an instruction to a switch structured to control transmission of electrical power. The method further includes sensing, by at least one sensor, a change in position of the switch in response to the instruction, and determining, by the at least one processor, a delay between the time at which the control circuitry sends the instruction and a time at which the change in position occurs. The method still further includes recording, by the at least one processor, the delay in a delay measurement queue and taking, by the at least one processor, an action with respect to the switch in response to the delay measurement queue.

16 Claims, 7 Drawing Sheets

(56) References Cited

U.S. PATENT DOCUMENTS

| | | | |
|---|---|---|---|
| 2012/0110386 A1* | 5/2012 | Hancock | G01R 31/40 |
| | | | 714/41 |
| 2015/0171662 A1 | 6/2015 | Lathrop et al. | |
| 2016/0173008 A1 | 6/2016 | Waltuch | |
| 2017/0302214 A1* | 10/2017 | Marcinkiewicz | H02P 27/08 |
| 2017/0366040 A1* | 12/2017 | Gould | H02J 9/06 |

* cited by examiner

AUTOMATIC TRANSFER SWITCH DEVICE HEALTH MONITORING

FIELD

The present invention relates generally to the field of power switches including circuit breakers and automatic transfer switches (ATSs).

BACKGROUND

Many types of power switch devices include various types of switch components that perform opening and closing operations. The switch components wear out over time. Wear on components can result in device failure that can, in some instances, cause significant damage to connected devices.

SUMMARY

According to an embodiment, a method includes measuring, by at least one processor, a time at which control circuitry sends an instruction to a switch structured to control transmission of electrical power. The method further includes sensing, by at least one sensor, a change in position of the switch in response to the instruction, and determining, by the at least one processor, a delay between the time at which the control circuitry sends the instruction and a time at which the change in position occurs. The method still further includes recording, by the at least one processor, the delay in a delay measurement queue and taking, by the at least one processor, an action with respect to the switch in response to the delay measurement queue.

According to another embodiment, an automatic transfer switch includes a first movable contact member at a first location; at least one sensor configured to sense a change in position of the first movable contact member from the first location; and a circuit configured to determine a delay between a time at which at least the first movable contact member is instructed to move and a time at which the change in position from the first location occurs, record the delay in a delay measurement queue, and take an action with respect to the switch in response to the delay measurement queue.

According to yet another embodiment, an apparatus includes control circuitry configured to sense a position of a contact and to deliver an instruction to the switch to effectuate a change in the position of the contact; and a timer configured to measure respective deviations between times at which the switch receives the instruction and times at which the position changes. The control circuitry is configured to record the respective deviations and to transmit a notification to a user in response to the measured respective deviations.

Additional features, advantages, and embodiments of the present disclosure may be set forth from consideration of the following detailed description, figures, and claims. Moreover, it is to be understood that both the foregoing summary of the present disclosure and the following detailed description are exemplary and intended to provide further explanation without further limiting the scope of the present disclosure.

BRIEF DESCRIPTION OF THE DRAWINGS

The accompanying figures, which are included to aid in understanding the disclosure, are incorporated in and constitute a part of this specification, illustrate the advantageous results produced by embodiments of the present disclosure and, together with the detailed description, serve to explain the principles of the present disclosure. No attempt is made to show details of the present disclosure to a greater extent than may be necessary for a fundamental understanding of the present disclosure and the various ways in which it may be practiced.

DETAILED DESCRIPTION

In the following detailed description, reference is made to the accompanying figures, which form a part hereof. In the figures, similar symbols typically identify similar elements, unless context dictates otherwise. The illustrative embodiments described in the detailed description, figures, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be performed, arranged, substituted, combined, and designed in a wide variety of different configurations, all of which are explicitly contemplated and made part of this disclosure.

As power switch devices such as circuit breakers and transfer switches wear out from usage, delays in opening and/or closing operations of the switch devices may deviate from calibrated values. In addition to wearing out from usage, which may lead to fatigue of specific electro-mechanical structures, other possible causes for deterioration of circuit breakers and transfer switches include extreme temperature and humidity, among other factors. Control circuitry is configured to measure and keep track of such delays in a queue and to notify a customer to perform maintenance on the power switch device proactively. Thus, by monitoring the 'health' of the power switch device, a user can perform preemptive maintenance rather than reacting to a breakage or error after the fact. Such an approach achieves greater accuracy than systems that merely periodically sample a power switch contact and perform delay measurements only for a synchronization check.

In particular, such synchronization checks involve periodically determining the change rates of a voltage difference and a phase angle difference between power sources (e.g., two power sources), and determining when to issue a close command in advance (e.g., at the time when two power sources are out of sync), so that when the switch closes when the power sources are paralleled, the power sources are synchronized.

Figure 5:
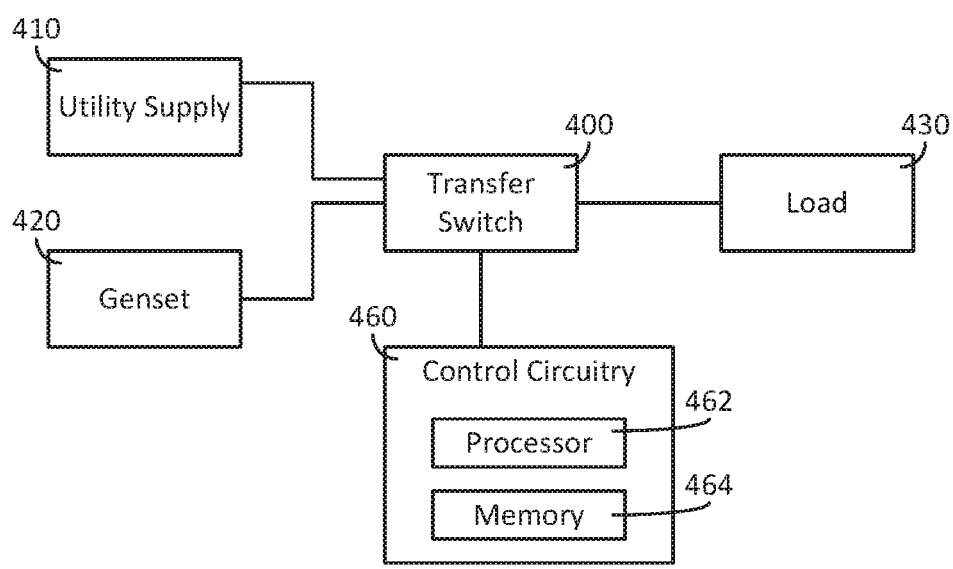
FIG. 5 depicts a block diagram according to an embodiment.

FIG. 5 depicts a block diagram according to an embodiment. An automatic transfer switch (ATS) according to one embodiment is an electrical or electronic switch which is configured to sense when a utility supply is interrupted, and is further configured to automatically connect a secondary supply, such as a generator set, to a load if the utility is unavailable. As shown in FIG. 5, an ATS 400 is connected to both of a utility (electrical grid) 410 and a generator set (also referred to as a 'genset') 420, where the utility grid 410 and genset 420 are input sources. It is noted, however, that in alternative embodiments, the ATS 400 may be connected to more than two input sources (for example, two utility grids and a genset). The ATS 400 is configured to supply a load 430 with power from one of the utility 410 or the generator set 420 at any particular instant.

The ATS 400 may include various components, including but not limited to relay switching components, timer relays, contactor switching components, and various sensors. The ATS 400 is configured to be controlled by control circuitry 460 having at least one processor 462 and a memory 464. The processor 462 may be a general-purpose processor, an application specific integrated circuit (ASIC), one or more field programmable gate arrays (FPGAs), a digital signal processor (DSP), a group of processing components, or other suitable electronic processing components. The memory 464 may store data and/or code for facilitating the function of the control circuitry 460. In particular, the memory 464 may store program-executable instructions which, when executed by the processor 462, cause the processor to perform operations in accordance with the exemplary embodiments described below. In some embodiments, the control circuitry 460 further includes a communication interface for receiving/transmitting information over a network.

Figure 6:
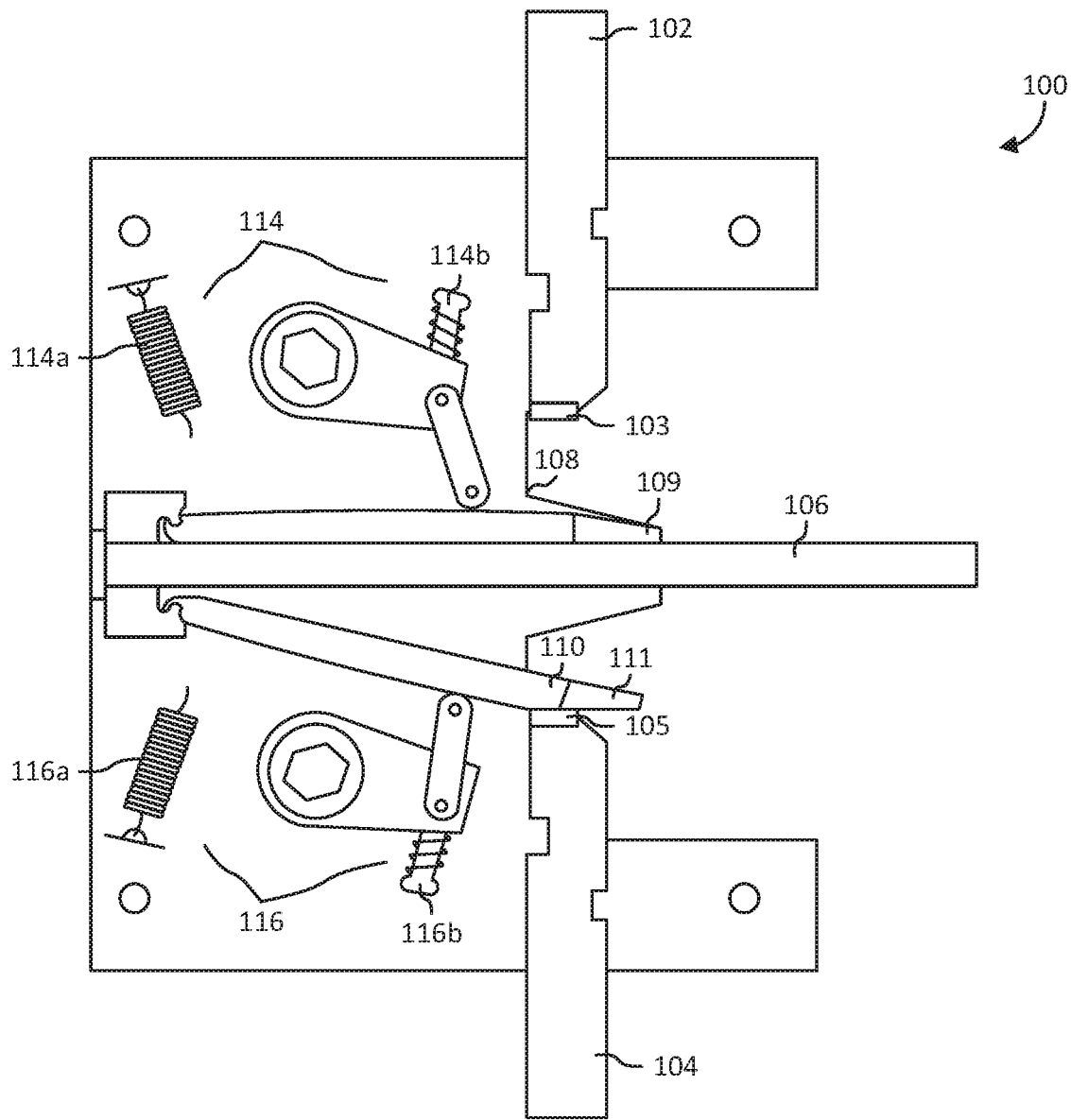
FIG. 6 depicts an automatic transfer switch cassette as may be used in accordance with an embodiment.

Turning to FIG. 6, a schematic diagram of an ATS cassette 100 is shown according to an exemplary embodiment. Cassette 100 includes a first source bar 102 with a first source contact pad 103, a second source bar 104 with a second source contact pad 105, a stationary bar 106, a first movable bar 108 with a first movable contact pad 109, a second movable bar 110 with a second movable contact pad 111, a first spring and mechanical linkage 114, and a second spring and mechanical linkage 116. Other configurations may be used, and the embodiment shown in FIG. 6 is exemplary and non-limiting. For example, various cartridge designs and circuit breakers such as those in fuse panels may be employed. As shown in FIG. 6, the first spring and mechanical linkage 114 includes a spring 114a that pulls from the bottom of the first movable bar 108 and a spring 114b that presses on top of the first movable bar 108. The second spring and mechanical linkage 116 includes a spring 116a that pulls from the bottom of the second movable bar 110 and a spring 116b that presses on top of the second movable bar 110. In some embodiments, the first source bar 102 and the second source bar 104 are fixed on the cassette 100. The first source bar 102 may be connected to a primary power source (not illustrated in the present figure), for example, a utility. The second source bar 104 may be coupled to a secondary power source, for example, the generator set 420 shown in FIG. 5. In some embodiments, the stationary bar 106 is also fixed on the cassette 100.

The stationary bar 106 may be coupled to an electrical load (not illustrated in the present figure), for example, a resistive load and/or a motor load. The load may include appliances, lights, or other loads desirable to power in the event of a utility electric grid failure. In some embodiments, stationary bar 106 is a T-shaped bar. It is noted that in various embodiments, the second source bar 104, the second movable bar 110, the second source contact pad 105, the second movable contact pad 111, and the second spring and mechanical linkage 116 may be omitted. In other embodiments, the stationary bar 106 may be lengthened and the second source bar 104, the second movable bar 110, the second source contact pad 105, the second movable contact pad 111, and second spring and mechanical linkage 116 may be placed further along the length of the stationary bar 106 on the same side and of the same orientation as the first source bar 102, the first movable bar 108, the first source contact pad 103, the first movable contact pad 109, and the first spring and mechanical linkage 114.

The first movable bar 108 and the second movable bar 110 are each electrically coupled and rotatably connected to the stationary bar 106. The first and second movable bars 108 and 110 each rotate between a closed position and an open position. As used herein, the "closed position" refers to the situation in which the movable bar engages the corresponding source bar of the power source that supplies power. The "open position" refers to the situation in which the movable bar disengages the corresponding source bar of the power source that is disconnected from the load. When power is being supplied from the primary power source, the first movable contact pad 109 at an end of the first movable bar 108 engages the first source contact pad 103 at an end of the first source contact 102.

In the configuration illustrated in FIG. 6, the first movable bar 108 is in the closed position and the electrical load is electrically connected to the primary power source. When there is an interruption in the primary power source, the first movable bar 108 rotates from the closed position to the open position to disengage the first movable contact pad 109 from the first source contact pad 103. The second movable bar 110 rotates from the open position to the closed position to allow the second movable contact pad 111 at an end of the second movable bar 110 to engage the second source contact pad 105 at an end of the second source contact 104. The electrical load is electrically connected to the secondary power source. It is noted that the ATS 400 must transition through a 'neutral' unconnected state briefly while transitioning, to avoid cross connection of sources. Alternatively, a cross-coupled transition is possible if sources are first synchronized to avoid power interruption. A similar operation is performed to transfer back to the primary power source from the secondary power source when the interruption is over. In some embodiments, the contacts pads 103, 105, 109, and 111 are made of silver alloy or copper alloy. Further, in certain implementations, a solenoid may control movement of the movable bars.

Figure 1:
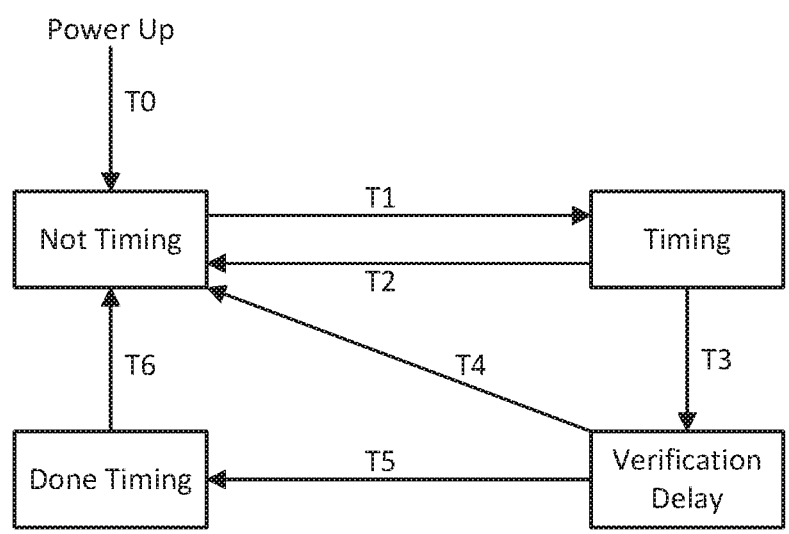
FIG. 1 depicts an open delay measurement state machine according to an embodiment.

Turning now to FIG. 1, an open delay measurement state machine is depicted according to an embodiment. In such an embodiment, a power switch open delay measurement starts when control circuitry commands a power switch device (e.g., a circuit breaker or transfer switch such as the ATS devices shown in FIGS. 5-6) to open. The control circuitry may be the control circuitry 460 of an ATS 400 as shown in FIG. 5, or the control circuitry may be a genset circuit breaker control circuitry or a switchgear master control circuitry.

As indicated in FIG. 1, the control circuitry causes the power switch device to transition from a powered off state to a powered on (or 'powered up') state at transition T0. The power switch device is initially in a state in which timing is not performed. The control circuitry sets an open delay measurement timer value to zero in such a "not timing" state. Transition T1 is a transition from non-activation to activating a command to commence timing. When the control circuitry commands the power switch to open, timing commences. Specifically, in transition T1, the power switch device open command changes from inactive to active, and a status of a position contact (e.g., "Contact A")

is closed, the control circuitry determines that a "power switch failure to open fault" is not present, and also determines that a "power switch position contact fault" is not present, such that the control circuitry deems the faults to be 'inactive.' The "power switch failure to open fault" and "power switch position contact fault" are discussed in greater detail below. In both cases, there is a ground fault with the ATS, and the ATS is already experiencing a failure mode. Thus, timing is not necessary. When timing does take place, the control circuitry causes an open delay measurement timer value to be incremented.

Table 1 below describes the logic for the open delay measurement state machine transitions, while Table 2 summarizes the different states of the open delay measurement state machine.

TABLE 1

| Transition | Condition | Transition Action |
|---|---|---|
| T0 | Power Up | None |
| T1 | Power Switch Device Open Command changes from Inactive to Active && Position Contact A Status == Closed && Power Switch Fail to Open Fault == Inactive && Power Switch Position Contact Fault == Inactive | None |
| T2 | Power Switch Device Open Command == Inactive \|\|Power Switch Fail to Open Fault == Active\|\| Power Switch Position Contact Fault == Active | None |
| T3 | Position Contact A Status == Open | Record the current Open Delay Measurement Timer Value |
| T4 | Power Switch Fail to Open Fault == Active\|\| Power Switch Position Contact Fault == Active | None |
| T5 | Verification Delay Timer Value >= max(Power Switch Position Contact Fault time delay, Power Switch Fail to Open Fault time delay) | None |
| T6 | "Done Timing" state actions are completed | None |

TABLE 2

Figure 2:
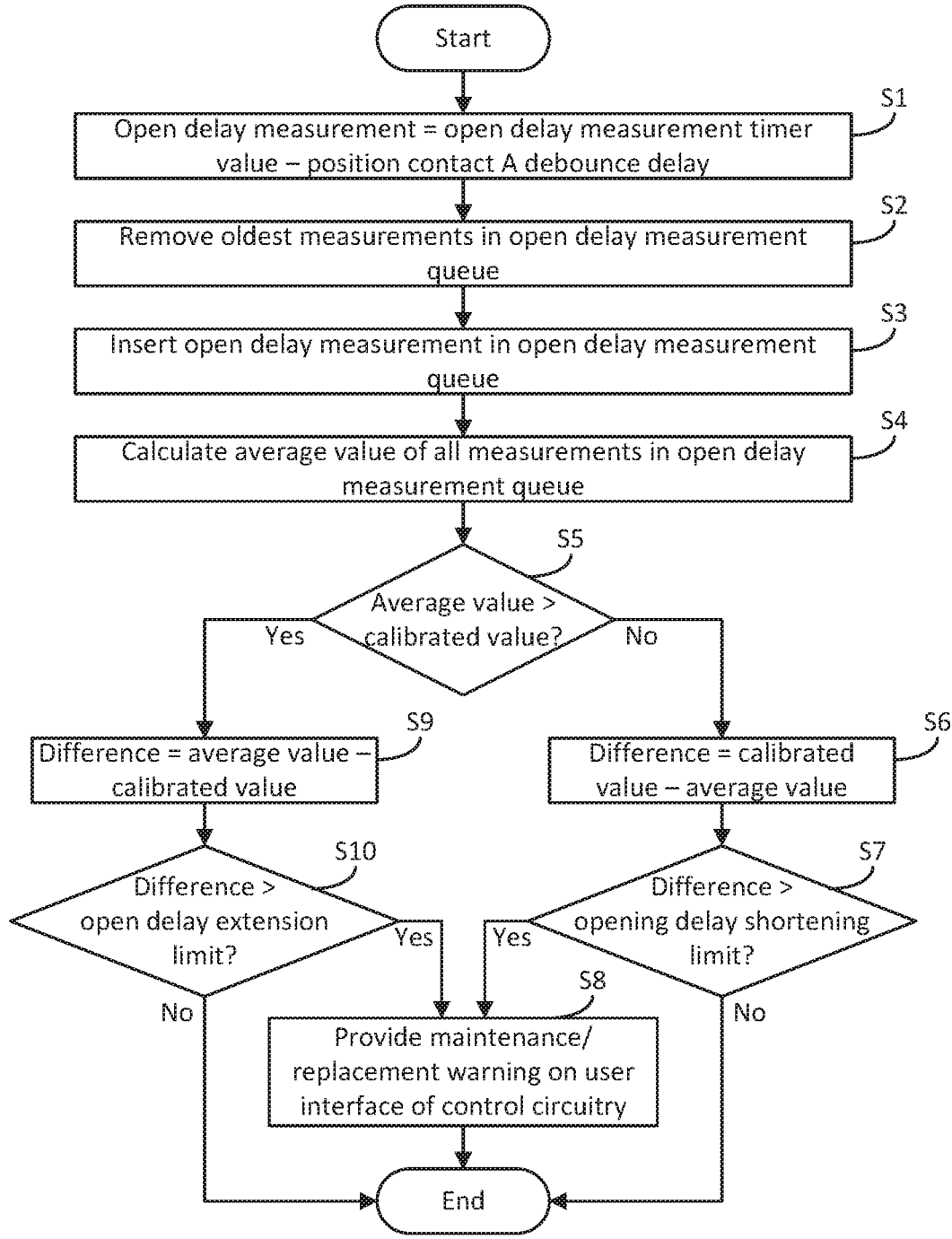
FIG. 2 depicts an open delay comparison process according to an embodiment.

| State | Entry Action | Action While in State |
|---|---|---|
| Not Timing | Open Delay Measurement Timer Value = 0 | None |
| Timing | None | Increment Open Delay Measurement Timer Value |
| Verification Delay | Verification Delay Timer Value = 0 | Increment Verification Delay Timer Value |
| Done Timing | Execute the open delay comparison logic shown in FIG. 2 | None |

Furthermore, a power switch device such as the ATS 100 shown in FIG. 6 may have either a dual-contact position sensing (Position Contact A and Position Contact B, such as the first sources 102, 104 shown in FIG. 6 with contact pads 103, 105, respectively) or a single-contact position sensing (Position Contact A only). More particularly, for dual-contact position sensing, contact pad 103 has a pair of position contacts (Position Contact A and Position Contact B) and contact pad 105 has a pair of position contacts (Position Contact A and Position Contact B). For dual-contact position sensing power switch devices, if a Position Contact A indicates the power switch device is closed but Position Contact B indicates it is open—or, conversely, Position Contact A indicates that the power switch device is open but Position Contact B indicates that it is closed—for a period of time, as in a power switch position contact fault time delay, for example, then the control circuitry judges that a "power switch position contact fault" is active, for example, or that a different fault is active. After the control circuitry sends out the open/close command to the power switch device, the device should open or close within a period of time. If the device fails to open or close within the given period of time, the control circuitry judges that a "power switch failure to open or close fault" is active. When any of the aforementioned faults happen, separately or in any combination, if a power switch open/close delay measurement is underway, the control circuitry aborts the power switch open/close delay measurement.

A transition T2 is a transition from performing timing to not performing timing, e.g., in the case of a fault. The control circuitry ends the timing operation when the control circuitry senses the power switch device to be in a desired position, and when the control circuitry records the position of the power switch device. In particular, in transition T2, the control circuitry does not perform the power switch device open command, and a power switch failure to open fault is active, or a power switch position contact fault is active.

Transition T3 is a transition between when the control circuitry commences timing and verifies whether there is a delay between when the control circuitry requests the power switch device to be moved to a desired position and when the control circuitry detects that the power switch device is moved to the desired position. Each delay corresponds to a deviation between when the control circuitry requests the power switch to be moved and when the control circuitry detects the power switch device to be so moved. Transition T3 is characterized by the Contact A being in an open position, for example, and the control circuitry recording the current open delay measurement timer value.

In the verification delay state, the control circuitry is configured to initially set a verification delay timer value to zero. The purpose of the "verification delay" state is to avoid the state machine transiting to a "done timing" state prematurely, in case a power switch position contact fault occurs sometime after Position Contact A indicates the switch is open. The premature transition could take place, for example, if Position Contact B never indicates that the first source side is open. In such a scenario, Transition T3 would be invalid due to the mismatch between Position Contact A and Position Contact B.

While in the verification delay state, the control circuitry is configured to increment the verification delay timer value. Transition T4 is a transition from a time of a verification delay to a state in which the control circuitry does not perform timing, e.g., in the case of a fault during a transition. For example, the power switch may have a failure to open fault or a power switch position contact fault. Transition T5 corresponds to a transition between a state when the control circuitry performs the verification delay to a state where the control circuitry completes timing operations, e.g., when a fault does not occur. As indicated in Table 2, during the "done timing" state, the control circuitry is configured to determine whether the "open delay measurement value" is above a threshold.

In the timing state, on the other hand, the control circuitry is configured to increment an "open delay measurement" timer. A process involving a transition from the timing state is discussed herein by way of example, with reference to the device shown in FIG. 6. As mentioned above, in the "dual-contact position sensing" mode, the first source contact pad 103 includes a first pair of position contacts, and the second source contact pad 105 includes a second pair of position contacts, as indicated in FIG. 6, where each pair of position contacts may be referred to as Position Contact A and Position Contact B, for example. Generally speaking, the first source side and the second source side of a transfer switch may open and close independently. For example, Position Contact A and Position Contact B of a source side may indicate an open/closed state of a power source switch independently.

In some circumstances, Contact A may indicate that a power source is closed while Contact B indicates that the power source is open, thus leading to a fault. In such circumstances, a current delay measurement should be discarded. Further, there may be a small time differential between when Contact A indicates the power source switch has arrived at a commanded destination position and when Contact B indicates that the same power source switch has arrived at the commanded destination position. The "verification delay" state, discussed below, allows for a period of time to verify that such a fault does not occur, in consideration of the noted time differential.

Due to the independent closure of the first and second source sides, a command to cause the first source side to open does not necessarily mean that a command to close the second source side will follow. In some embodiments, both sides of transfer switch 400 may stay open or close together. The open delay measurement and the close delay measurement of the first source side may be independently measured, in accordance with commands to the respective source sides to conduct a corresponding movement. Put another way, the open delay measurement and the close delay measurement of the first source side may be performed separately and independent of the open delay and close delay measurements of the second source side. With reference to the transfer switch 400 described above, after the transfer switch 400 is commanded to open on the first source side, the Position Contact A may indicate that the first source side is open. At this time, the state machine transits from the "timing" state to the "verification delay" state. Upon leaving the "timing" state, the "open delay measurement" timer value is recorded as the potential "open delay measurement value." Upon entering the "verification delay" state, another timer, the "verification delay" timer, starts timing.

The control circuitry determines that a fault has occurred, for example, if the verification delay timer value is greater than the larger of a power switch position contact fault time delay or a power switch failure to open fault time delay. Transition T6 corresponds to a transition between a state in which the control circuitry completes timing operations and in which the control circuitry sets a delay measurement timer value to zero. During the transition T6, the control circuitry is configured to compare the time at which the control circuitry commanded the power switch device to open and when the control circuitry detects the power switch device to be in the opened position, i.e., the actual transition time for that source branch of the ATS switch. The control circuitry is configured to cease measurement of the respective delays by the timer upon determining that the at least one contact incorrectly indicates whether the switch is opened or closed. The timer may be configured to initiate and terminate measurement of the delay with a predetermined latency time of less than 1 msec, according to an exemplary embodiment. In other embodiments, the latency time may be 0.1 seconds, for example.

As described above, the control circuitry starts the power switch open delay measurement when the control circuitry commands the power switch device to open. The power switch open delay ends when the control circuitry senses the power switch device to be in the open position. On the other hand, a power switch close delay measurement starts when the control circuitry commands a power switch device to close, and ends when the control circuitry senses the power switch device to be in the closed position. Table 3 summarizes the different states of the close delay measurement state machine. Table 4 below describes the logic for the close delay measurement state machine transitions.

TABLE 3

| State | Entry Action | Action While in State |
| --- | --- | --- |
| Not Timing | Close Delay Measurement Timer Value = 0 | None |
| Timing | None | Increment Close Delay Measurement Timer Value |
| Verification Delay | Verification Delay Timer Value = 0 | Increment Verification Delay Timer Value |
| Done Timing | Execute the open delay comparison logic shown in FIG. 2 Error! Reference source not found. | None |

TABLE 4

| Transition | Condition | Transition Action |
| --- | --- | --- |
| T0 | Power Up | None |
| T1 | Power Switch Device Close Command changes from Inactive to Active && Position Contact A Status == Open && Power Switch Fail to Close Fault == Inactive && Power Switch Position Contact Fault == Inactive | None |
| T2 | Power Switch Device Close Command == Inactive \|\|Power Switch Fail to Close Fault == Active\|\| | None |

TABLE 4-continued

| Transition | Condition | Transition Action |
|---|---|---|
| T3 | Power Switch Position Contact Fault == Active<br>Position Contact A Status == Closed | Record the current Close Delay Measurement Timer Value |
| T4 | Power Switch Fail to Close Fault == Active\|\|<br>Power Switch Position Contact Fault == Active | None |
| T5 | Verification Delay Timer Value >= max(Power Switch Position Contact Fault time delay, Power Switch Fail to Close Fault time delay) | None |
| T6 | "Done Timing" state actions are completed | None |

The specific measurements performed to assess delays differ based on the nature of the power switch device. For example, for a circuit breaker device, there are separate measurements for the open delay and the close delay. For a transfer switch device, there are separate measurements for the open delay and the close delay for both sides of a transfer pair. Regardless, the control circuitry records power switch open delay measurements and power switch close delay measurements alike in an open delay measurements queue and a close delay measurements queue, respectively. The open/close delay measurements queues may have a fixed, finite number of elements (e.g., q1 . . . qn, where n is a predetermined value). The fixed number of elements may be 5, 10, 15, 20, 25, or 100, for example.

Upon initialization, the control circuitry sets all elements in the open/close delay measurements queues to calibrated values for the applicable devices being used, so as to start with nominal measurements (such as nominal factory timings and/or design specifications for the ATS 400, for example). The queue is then filled as new measurements are taken. The nominal measurements may be derived from collected open/close delay measurement data (e.g., average values for open and close delay measurements from the collected data). In particular, the nominal values are calibration values that may be 'known good' measurements derived from experimental or field data used to calculate (e.g., via averaging) a nominal open/close delay. In some implementations, the queue may not be 'pre-filled' with such calibration values and may be populated with new values.

In the embodiment shown in FIG. 1, the open delay measurement may rely on the sensing result of Position Contact A and not on any sensing of a position of another ATS element. Similarly, the close delay measurement may likewise rely on the sensing result of Position Contact A and not on any other sensed positions, and the control circuitry may control the close delay measurement according to a similar state machine. In certain implementations, it is preferable not to rely on Position Contact B alone, as Position Contact A may correctly indicate a change in position of a power switch device at a different rate (faster or slower) than Position Contact B. The verification delay state allows for evaluation of a difference in delay measurement among contacts, e.g., Position Contacts A and B. A difference between a delay measurement for a first contact (Contact A) and a delay measurement for a second contact (Contact B) may be limited, for example, to be less than a threshold (e.g., 300 msec) in some implementations. If the threshold is exceeded, a fault is announced. In some implementations, the smaller of the Contact A delay measurement and the Contact B delay measurement is utilized as a delay measurement for a corresponding power source switch.

In some implementations, a combined result of Position Contact A and Position Contact B may be used. However, relying on a combined result of Position Contacts A and B may lead to less accurate measurement, because the combined result is not available until after a sensing result of each individual contact becomes available. If a combined measurement is used, the combined measurement may be compared to individual measurements as part of a check for false negative and false positive results. Further, an embedded control application according to certain implementations may employ two or more independent state machines for delay measurement.

FIG. 2 depicts an open delay comparison process according to an embodiment. Upon initiation of the open delay comparison process, the control circuitry (such as the control circuitry 460) is configured to perform an open delay measurement. The control circuitry is configured to perform the open delay measurement by measuring a time at which the control circuitry sends an instruction to a switch structured to control transmission of electrical power. The process further comprises sensing, by at least one sensor, a change in position of the switch in response to the instruction, and determining a delay between the time at which the control circuitry sends the instruction and a time at which the change in position occurs. In particular, as shown in FIG. 2, the control circuitry performs the open delay measurement by determining the difference between an open delay measurement timer value and a debounce delay of a Position Contact A at step S1. As mentioned above, the control circuitry stores such measurements in a delay measurement queue. A debounce delay is a delay which is deliberately provided to counteract 'bounce' which occurs when the switch contacts bang against each other rather than contact with each other cleanly.

As shown in FIG. 2, at step S2, the processor discards an oldest measurement in the open delay measurement queue (or multiple old measurements, in some embodiments). At step S3, the processor records the new delay in the open delay measurement queue. By discarding the older or oldest values, memory is freed up for newer measurements, such that the queue is replenished. The control circuitry is configured to record a finite number of deviations in a given time period and to discard a record of a prior measured deviation upon generating a record of a subsequent measured deviation, in some embodiments. In some embodiments, the control circuitry does not discard an older measurement each time a new measurement is added to the queue.

At step S4, the control circuitry calculates the average value of measured delays in the open delay measurement queue. In other words, the control circuitry compares the average value of measured delays in the delay measurement queue to a reference delay value. By using the average value, accidental or highly anomalous behavior does not dictate the delay determination. However, in some embodiments, measurements are checked for standard deviation, to see if there is a pattern of variable or anomalous delays, which could also indicate that there likely is a pending failure. Next, at step S5, the control circuitry compares the average value that was previously calculated to a calibrated value. A pattern of variance may indicate a pending failure, as may a single large variance such as a 'spike.' If the average value is greater than the calibrated value, then the control circuitry calculates the average value less the calibrated value at step S9. Then, the control circuitry compares the average value less the calibrated value to an open delay extension limit at step S10.

The above-mentioned open delay extension limit may be determined based on the technical specifications of the power switch device, among other factors, such as application-specific considerations. In certain implementations, the reference delay value may be adjusted by the open delay extension limit, which is a threshold value. In some implementations, open/close delay measurement data gathered from fielded systems or experimental usage are used to calculate (generally via averaging) a nominal open/close delay, and an associated range for such open/close delay. A difference between the nominal value and the lower limit of the range is the delay shortening limit, while a difference between the upper limit of the range and the nominal value is the delay extension limit.

By using the average value and a continuously replenished delay measurement queue, the control circuitry may assess the performance of opening and closing operations with greater accuracy compared to using a fixed delay or a periodically sampled delay. Further, in certain implementations, the average value may be supplemented or replaced by a median value. Further still, the control circuitry may generate a statistical distribution of delays and use the statistical distribution to take an action with respect to the power switch device in response to the delay measurement queue, as discussed further below.

The control circuitry is configured to take an action with respect to the switch in response to the delay measurement queue. Specifically, following step S10, if the average value less the calibrated value is greater than the open delay extension limit, then control circuitry provides a notification. Specifically, the control circuitry is configured to generate a notification upon determining that the difference between the average value and the (calibrated) reference delay value exceeds the extension limit, which is a threshold, and transmits the notification to a user at step S8. The notification may be an announcement that maintenance or replacement is needed, and may be shown on a user interface of the power switch device control circuitry. The control circuitry may be configured to transmit the notification to a mobile device and/or to transmit notifications by e-mail. Further, the notifications may include an audible message and/or a visual warning such as a flashing warning light. If the average value less the calibrated value is less than the extension limit, the process terminates.

On the other hand, if, at step S5, the average value of measured delays is determined to be less than the calibrated value, then the control circuitry calculates a difference as the calibrated value less the average value at step S6. The control circuitry then compares this difference in turn to an opening delay shortening limit at step S7. If the calibrated value less the average value is not less than the open delay shortening limit, the control circuitry terminates the process. If the calibrated value less the average value is greater than the shortening limit, then the control circuitry provides a notification as described above at step S8.

Figure 3:
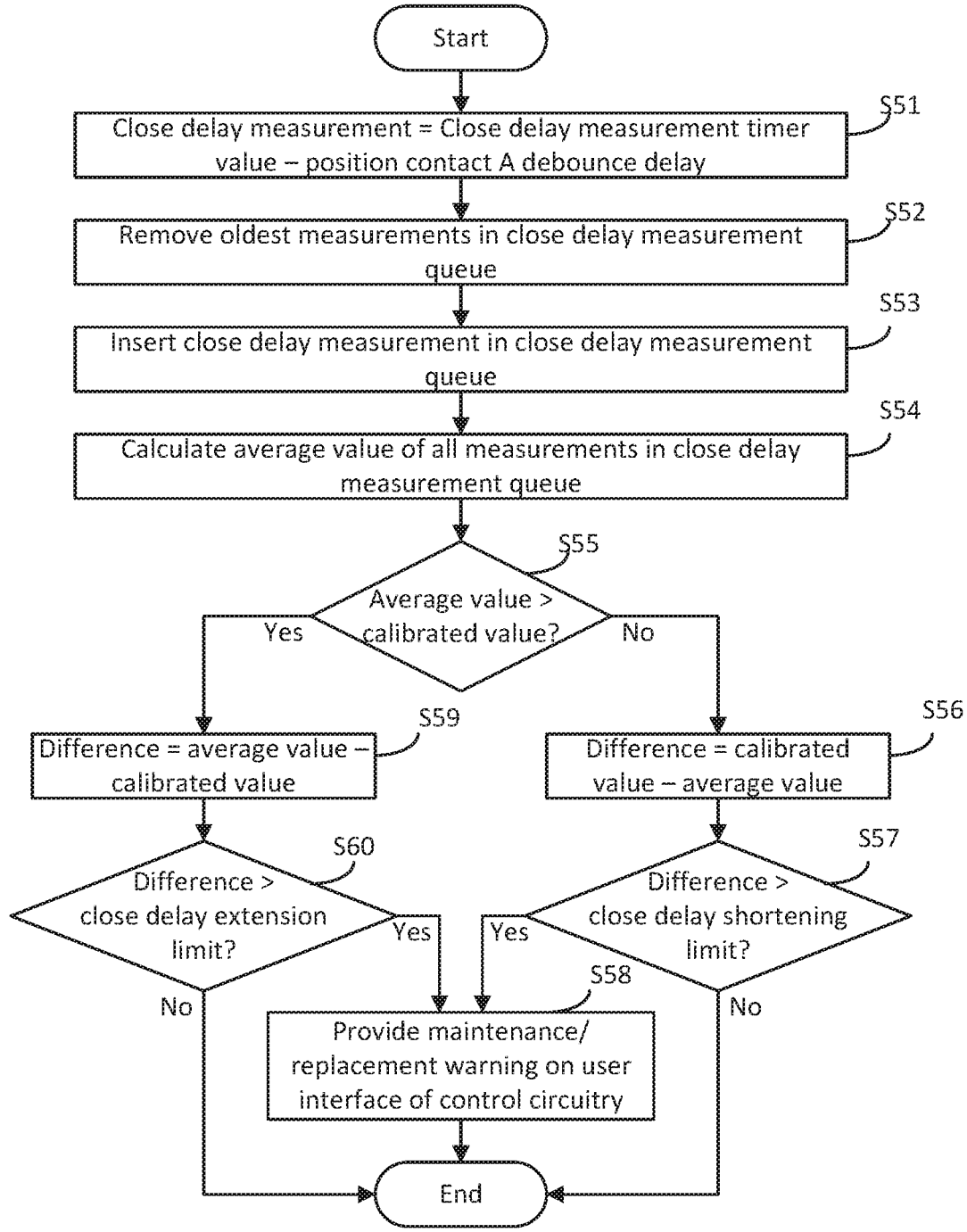
FIG. 3 depicts a close delay comparison process according to an embodiment.

FIG. 3 depicts a close delay comparison process according to an embodiment, which is similar to the open delay comparison process of the embodiment depicted in FIG. 2. Upon initiation of the close delay comparison process, the control circuitry (such as the control circuitry 460) is configured to perform a close delay measurement. The control circuitry performs the close delay measurement by determining the difference between a close delay measurement timer value and a debounce delay of a Position Contact A at step S51. As shown in FIG. 3, at step S52, the processor discards an oldest measurement in a close delay measurement queue (or multiple old measurements, in some embodiments).

At step S53, the processor records the new delay in the close delay measurement queue. At step S54, the control circuitry calculates the average value of measured delays in the close delay measurement queue. As with the open delay measurement process, in some embodiments, the standard deviation of measurements may be evaluated for indications of a pending failure. At step S55, the control circuitry compares the average value that was previously calculated to a calibrated value. If the average value is greater than the calibrated value, then the control circuitry calculates the average value less the calibrated value at step S59, and compares the average value less the calibrated value to a close delay extension limit at step S60.

As with the open delay extension limit, the close delay extension limit may be determined based on the technical specifications of the power switch device, among other factors, such as application-specific considerations. Further, a reference delay value may be adjusted by the close delay extension limit, which is a threshold value. As mentioned above, open/close delay measurement data gathered from fielded systems or experimental usage may be used to calculate (generally via averaging) a nominal open/close delay, and an associated range for such open/close delay.

Further, if the average value less the calibrated value is greater than the close delay extension limit, then control circuitry provides a notification. Specifically, the control circuitry is configured to generate a notification upon determining that the difference between the average value and the (calibrated) reference delay value exceeds the extension limit, which is a threshold, and transmits the notification to a user at step S58, in a similar manner as described above regarding FIG. 2.

However, if, at step S55, the average value of measured delays is determined to be less than the calibrated value, then the control circuitry calculates a difference as the calibrated value less the average value at step S56. The control circuitry then compares this difference in turn to a close delay shortening limit at step S57. If the calibrated value less the average value is not less than the close delay shortening limit, the control circuitry terminates the process. If the calibrated value less the average value is greater than the shortening limit, then the control circuitry provides a notification as described above at step S58.

Figure 4:
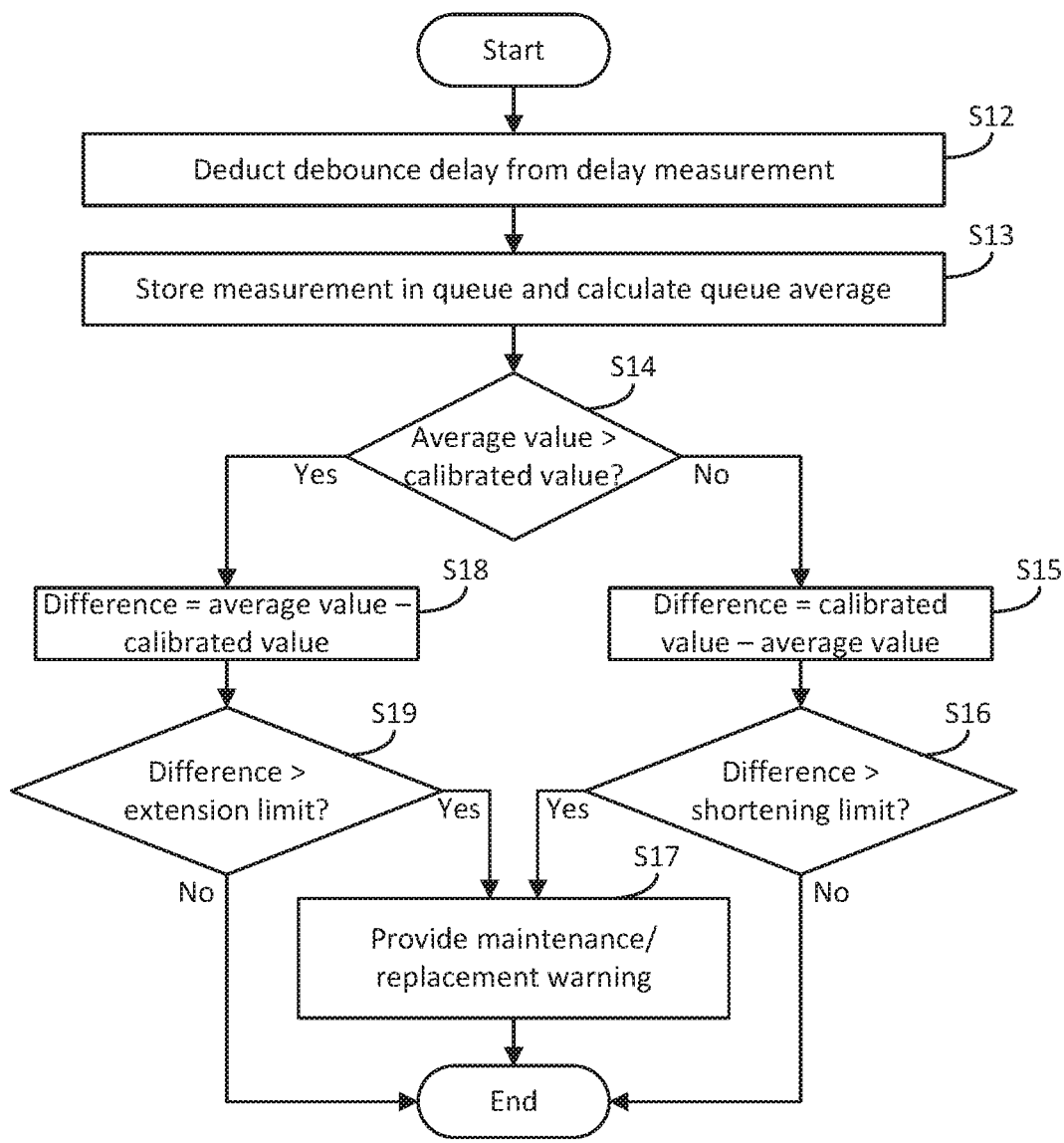
FIG. 4 depicts a delay comparison process according to an embodiment.

FIG. 4 depicts a process for managing delay measurements according to an embodiment. The processor is configured to adjust the delay between the time at which the control circuitry sends an instruction and the time at which a change in position occurs by a debounce value before recording the delay in the delay measurement queue at step S12. As shown in FIG. 4, the control circuitry may store the resulting measured delay in a queue, and calculate an average of values in the queue at step S13. Similarly to the process shown in FIG. 2, the control circuitry compares the average value to a calibrated reference value at step S14.

When the average is less than the calibrated value, the control circuitry computes the value of the calibrated value less the average value at step S15. The control circuitry then compares this value to a delay shortening limit at S16, and the control circuitry issues a maintenance warning at step S17 if the calibrated value less the average value is greater than the shortening limit. On the other hand, if the average value is greater than the calibrated value, then the control circuitry compares average value less the calibrated value, as calculated at step S18, to an extension limit. The control circuitry issues an announcement if the average value less the calibrated value as calculated at step S19 is greater than the extension limit. Otherwise, the control circuitry terminates the process.

Figure 7:
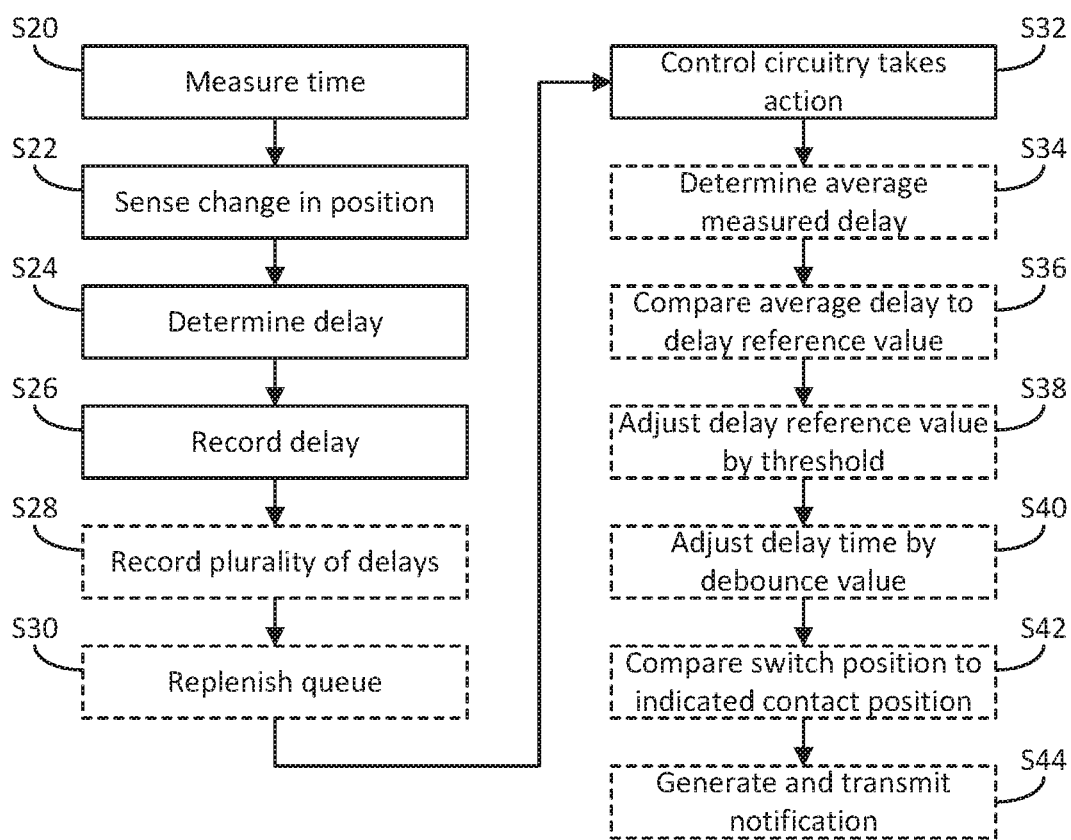
FIG. 7 depicts a method according to an embodiment.

FIG. 7 depicts a method according to an embodiment. The method includes measuring, at step S20, a time at which control circuitry sends an instruction to a switch structured to control transmission of electrical power. The method further includes sensing, by at least one sensor, a change in position of the switch in response to the instruction, at step S22. The method still further includes determining, at step S24, a delay between the time at which the control circuitry sends the instruction and a time at which the change in position occurs. The method additionally includes recording, at step S26, the delay in a delay measurement queue. Such measurements, determinations and recording may be performed by control circuitry including at least one processor such as the processor 462 described above. The method further includes taking, at step S32, an action by at least one processor with respect to the switch in response to the delay measurement queue.

The method may optionally include certain steps as indicated in the dashed portions of FIG. 7. For example, recording the delay may further include recording, at step S28, a plurality of measured delay values in the delay measurement queue, and replenishing, at step S30, the delay measurement queue by discarding an oldest measured delay value upon recording a newest measured delay value. Further, the method may optionally include determining, at step S34, an average value of measured delays in the delay measurement queue. The method may further optionally include comparing, at step S36, the average value of measured delays in the delay measurement queue to a reference delay value. The method may further optionally include, at step S38, adjusting the reference delay value by the threshold value. The method may further include, at step S40, adjusting the delay between the time at which the control circuitry controller sends the instruction and the time at which the change in position occurs by a debounce value before recording the delay in the delay measurement queue. The method may optionally include, at step S42, comparing the position of the switch to an indication of a position of at least one contact thereon. Further, the method may optionally include generating, at step S44, a notification upon determining that a difference between the average value and the reference delay value exceeds a threshold value, and transmitting the notification to a user. Instead of or in addition to the average value, other values may be used, including measurements derived from a rolling window of measurements or a continuous queue of measurement data.

Further still, the techniques described herein may be applied to a variety of ATS devices. In particular, such ATS devices may include sensors is further configured to sense a change in position of the second movable contact member from the second location. Such ATS devices may also include one or more solenoids permitting movement of one or more movable contact members. Timing may vary with the particular ATS application, as well as with the voltages used by a particular ATS (for example, single phase, two phase, three phase, 120V, 240V, 308V, 480V, etc.).

Further, the control circuitry of the ATS may include a circuit configured to determine a delay between a time at which at least the first movable contact member is instructed to move and a time at which the change in position from the first location occurs, to record the delay in a delay measurement queue, and to take an action with respect to the switch in response to the delay measurement queue, such as the notifications described above. The circuit may further be configured to perform a first comparison between an average value of the plurality of delays in the delay measurement queue to a calibrated value. The circuit may be further configured to perform a second comparison entailing comparing a median value of the plurality of delays in the delay measurement queue to the average value of the plurality of delays in the delay measurement queue, and to determine whether to transmit the notification to the user in response to the second comparison.

Certain functional units described in this specification have been labeled as circuitry or circuits, in order to more particularly emphasize their implementation independence. For example, a circuit may be implemented as a hardware circuit comprising custom very-large-scale integration (VLSI) circuits or gate arrays, off-the-shelf semiconductors such as logic chips, transistors, or other discrete components. A circuit may also be implemented in programmable hardware devices such as field programmable gate arrays, programmable array logic, programmable logic devices or the like.

As mentioned above, circuits may also be implemented in machine-readable medium for execution by various types of processors. An identified circuit of executable code may, for instance, comprise one or more physical or logical blocks of computer instructions, which may, for instance, be organized as an object, procedure, or function. Nevertheless, the executables of an identified circuit need not be physically located together, but may comprise disparate instructions stored in different locations which, when joined logically together, comprise the circuit and achieve the stated purpose for the circuit. Indeed, a circuit of computer readable program code may be a single instruction, or many instructions, and may even be distributed over several different code segments, among different programs, and across several memory devices. Similarly, operational data may be identified and illustrated herein within circuits, and may be embodied in any suitable form and organized within any suitable type of data structure. The operational data may be collected as a single data set, or may be distributed over different locations including over different storage devices, and may exist, at least partially, merely as electronic signals on a system or network.

The computer readable medium (also referred to herein as machine-readable media or machine-readable content) may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing. As alluded to above, examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD- ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. As also alluded to above, computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer), partly on the user's computer, as a stand-alone computer-readable package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

While this specification contains specific implementation details, these should not be construed as limitations on the scope of any inventions or of what may be claimed, but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be depicted in a particular order, this should not be understood as requiring that such operations be performed in the particular order shown or in sequential order, or that all operations be performed, to achieve desirable results. Moreover, the separation of various aspects of the implementations described above should not be understood as requiring such separation in all implementations, and it should be understood that the described methods can generally be integrated in a single application or integrated across multiple applications.

The techniques and systems as shown in the various exemplary embodiments, are illustrative only. Although only certain embodiments have been described in detail in this disclosure, many modifications are possible (e.g., variations in elements, values of parameters, algorithms, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

As may be utilized herein, the term "substantially" and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to any precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements are merely used to describe the orientation of various elements in the drawings. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

What is claimed is:
1. A method, comprising:
measuring, by at least one processor, a time at which control circuitry sends an instruction to a movable contact of an automatic transfer switch structured to control transmission of electrical power;

sensing, by at least one sensor, a change in position of the movable contact of the automatic transfer switch in response to the instruction;
determining, by the at least one processor, a delay between the time at which the control circuitry sends the instruction and a time at which the change in position occurs;
recording, by the at least one processor, the delay in a delay measurement queue;
determining, by the at least one processor, an average value of measured delays in the delay measurement queue;
comparing, by the at least one processor, the average value of measured delays in the delay measurement queue to a reference delay value; and
taking, by the at least one processor, an action with respect to the automatic transfer switch in response to the delay measurement queue
wherein taking an action with respect to the automatic transfer switch comprises:
generating a notification upon determining that a difference between the average value and the reference delay value exceeds a threshold value; and
transmitting the notification to a user; and
wherein the method further comprises adjusting the reference delay value by the threshold value.

2. The method of claim 1, wherein the automatic transfer switch is configured to supply a load with power from one of a utility grid or a generator set.

3. The method of claim 1, further comprising:
comparing the position of the automatic transfer switch to an indication of a position of at least one contact thereon.

4. A method comprising:
measuring, by at least one processor, a time at which control circuitry sends an instruction to a movable contact of an automatic transfer switch structured to control transmission of electrical power, the control circuitry comprising the at least one processor;
sensing, by at least one sensor, a change in position of the movable contact of the automatic transfer switch in response to the instruction;
determining, by the at least one processor, at least one delay between the time at which the control circuitry sends the instruction and a time at which the change in position occurs;
recording, by the at least one processor, a plurality of delays, including the at least one delay, in a delay measurement queue;
adjusting, by the at least one processor, the at least one delay between the time at which the control circuitry sends the instruction and the time at which the change in position occurs by a debounce value before recording the at least one delay in the delay measurement queue,
performing a first comparison of an average value of the measured delays in the delay measurement queue to a calibrated value,
determining whether to transmit a notification to a user in response to the first comparison, wherein transmission of the notification comprises an action to be taken by the at least one processor with respect to the automatic transfer switch in response to the delay measurement queue;
performing a second comparison that is a comparison of a median value of the measured delays in the delay measurement queue to the average value of the measured delays in the delay measurement queue, and determining whether to transmit the notification to the user in response to the second comparison.

5. A method comprising:
measuring, by at least one processor, a time at which control circuitry sends an instruction to a movable contact of an automatic transfer switch structured to control transmission of electrical power;
sensing, by at least one sensor, a change in position of the movable contact of the automatic transfer switch in response to the instruction;
determining, by the at least one processor, a delay between the time at which the control circuitry sends the instruction and a time at which the change in position occurs;
recording, by the at least one processor, the delay in a delay measurement queue,
wherein recording the delay comprises:
recording a plurality of measured delay values in the delay measurement queue; and
replenishing the delay measurement queue by discarding an oldest measured delay value upon recording a newest measured delay value,
comparing, by the at least one processor, the average value of measured delays in the delay measurement queue to a reference delay value, and
taking, by the at least one processor, an action with respect to the automatic transfer switch in response to the delay measurement queue,
wherein taking an action with respect to the automatic transfer switch comprises:
generating a notification upon determining that a difference between the average value and the reference delay value exceeds a threshold value; and
transmitting the notification to a user; and
wherein the method further comprises adjusting the reference delay value by the threshold value.

6. An automatic transfer switch, comprising:
a first movable contact member at a first location;
at least one sensor configured to sense a change in position of the first movable contact member from the first location; and
a circuit configured to
determine at least one delay between a time at which at least the first movable contact member is instructed to move and a time at which the change in position from the first location occurs;
record a plurality of delays including the at least one delay in a delay measurement queue;
determine an average value of measured delays in the delay measurement queue, and
perform a first comparison of the average value of the measured delays in the delay measurement queue to a calibrated value,
determine whether to transmit a notification to a user in response to the first comparison, wherein transmitting the notification to the user comprises taking an action with respect to the automatic transfer switch in response to the delay measurement queue, and
perform a second comparison, the second comparison being a comparison of a median value of the measured delays in the delay measurement queue to the average value of the measured delays in the delay measurement queue, and to determine whether to transmit the notification to the user in response to the second comparison.

7. The automatic transfer switch of claim 6, further comprising:
a second movable contact member at a second location,
wherein the at least one sensor is further configured to sense a change in position of the second movable contact member from the second location, and
wherein the circuit is configured to determine another delay between a time at which at least the second movable contact member is instructed to move and a time at which the change in position from the second location occurs, and record the another delay in another delay measurement queue.

8. The automatic transfer switch of claim 6, wherein the circuit is further configured to:
receive information from the sensor indicative of the position of the first movable contact member; and
update a record indicative of a status of the first movable contact member in response to the information received from the sensor.

9. The automatic transfer switch of claim 6, wherein the circuit comprises a timer configured to initiate and terminate measurement of the at least one delay within a predetermined latency time.

10. The automatic transfer switch of claim 6, further comprising:
a solenoid permitting movement of the first movable contact member at the first location,
wherein the circuit is configured to predict a failure of the automatic transfer switch in response to at least one electrical characteristic of the solenoid.

11. An apparatus, comprising:
control circuitry configured to sense a position of a movable contact of an automatic transfer switch, and to deliver an instruction to the automatic transfer switch, the automatic transfer switch being structured to control transmission of electrical power, wherein the instruction is configured to effectuate a change in the position of the movable contact of the automatic transfer switch; and
a timer configured to measure respective deviations between times at which the automatic transfer switch receives the instruction and times at which the position changes;
wherein the control circuitry is configured to
record the measured respective deviations in a delay measurement queue and to transmit a notification to a user in response to the measured respective deviations,
determine an average value of the measured respective deviations in the delay measurement queue,
compare the average value of the measured respective deviations in the delay measurement queue to a reference deviation value, and
take an action with respect to the automatic transfer switch in response to the delay measurement queue,
wherein taking an action with respect to the automatic transfer switch comprises:
generating a notification upon determining that a difference between the average value and the reference deviation value exceeds a threshold value; and
transmitting the notification to a user; and
wherein the control circuitry is further configured to adjust the reference deviation value by the threshold value.

12. The apparatus of claim 11, wherein:
the control circuitry is configured to set an initial value of each deviation to a calibrated value, and to compare the calibrated value to the average value of the measured respective deviations.

13. The apparatus of claim 11, wherein the control circuitry is configured to compare a position of the movable contact of the automatic transfer switch to an indication of the position of the movable contact received by the control circuitry.

14. The apparatus of claim 13, wherein the timer ceases measurement of the respective deviations upon a determination by the control circuitry that the movable contact incorrectly indicates whether the automatic transfer switch is opened or closed.

15. The apparatus of claim 11, wherein the control circuitry is configured to record a finite number of deviations in a given time period and to discard a record of a prior measured deviation upon generating a record of a subsequent measured deviation.

16. The apparatus of claim 11, further comprising the automatic transfer switch, wherein the automatic transfer switch is structured to control transmission of electrical power between a generator set and an electrical grid.

* * * * *